(12) United States Patent
Yokouchi

(10) Patent No.: US 9,633,868 B2
(45) Date of Patent: Apr. 25, 2017

(54) HEAT TREATMENT METHOD AND HEAT TREATMENT APPARATUS

(71) Applicant: DAINIPPON SCREEN MFG. CO., LTD., Kyoto (JP)

(72) Inventor: Kenichi Yokouchi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 237 days.

(21) Appl. No.: 14/361,000

(22) PCT Filed: Oct. 18, 2012

(86) PCT No.: PCT/JP2012/076914
§ 371 (c)(1),
(2) Date: May 28, 2014

(87) PCT Pub. No.: WO2013/084598
PCT Pub. Date: Jun. 13, 2013

(65) Prior Publication Data
US 2014/0329340 A1    Nov. 6, 2014

(30) Foreign Application Priority Data

Dec. 7, 2011    (JP) .................................. 2011-267548

(51) Int. Cl.
*A21B 2/00*    (2006.01)
*F26B 19/00*    (2006.01)
(Continued)

(52) U.S. Cl.
CPC .......... *H01L 21/324* (2013.01); *H01L 21/265* (2013.01); *H01L 21/67115* (2013.01);
(Continued)

(58) Field of Classification Search
CPC ................. H01L 21/265; H01L 21/324; H01L 21/67115; H01L 21/6875; H01L 22/14; H05B 3/0047
(Continued)

(56) References Cited

U.S. PATENT DOCUMENTS 8,145,046 B2    3/2012    Kiyama et al. ............... 392/418
8,498,525 B2    7/2013    Kiyama et al. ............... 392/407
(Continued)

FOREIGN PATENT DOCUMENTS

JP    2009-070948    4/2009
JP    2009-0099758    5/2009
(Continued)

OTHER PUBLICATIONS

International Preliminary Report on Patentability (IPRP) issued by the IPEA/EP Patent.
(Continued)

*Primary Examiner* — Dana Ross
*Assistant Examiner* — Lindsey C Staubach
(74) *Attorney, Agent, or Firm* — Ostrolenk Faber LLP

(57) ABSTRACT

After a substrate implanted with impurities is heated to a preheating temperature, the front surface of the substrate is heated to a target temperature by irradiating the front surface of the substrate with a flash of light. Further, the flash irradiation is continued to maintain the temperature of the front surface near the target temperature for a predetermined time period. At this time, a flash irradiation time period in the flash heating step is made longer than a heat conduction time period required for heat conduction from the front surface of the substrate to the back surface thereof, and a difference in temperature between the front and back surfaces of the substrate is controlled to be always not more than one-half of an increased temperature from the preheat-
(Continued)

ing temperature to the target temperature during the flash irradiation. This alleviates the concentration of stresses resulting from a difference in thermal expansion between the front and back surfaces of the substrate to thereby prevent the cracking of the substrate.

5 Claims, 14 Drawing Sheets

(51) Int. Cl.
    *F26B 3/30* (2006.01)
    *F21V 7/00* (2006.01)
    *G02B 17/00* (2006.01)
    *H01L 21/324* (2006.01)
    *H01L 21/265* (2006.01)
    *H01L 21/67* (2006.01)
    *H01L 21/687* (2006.01)
    *H01L 21/66* (2006.01)
    *H05B 3/00* (2006.01)
    *H01L 29/78* (2006.01)

(52) U.S. Cl.
    CPC .......... *H01L 21/6875* (2013.01); *H01L 22/14* (2013.01); *H05B 3/0047* (2013.01); *H01L 29/7833* (2013.01)

(58) Field of Classification Search
    USPC .................... 392/411, 416, 418, 419; 438/10
    See application file for complete search history.

(56) References Cited

U.S. PATENT DOCUMENTS

| | | | | |
|---|---|---|---|---|
| 2002/0067918 | A1* | 6/2002 | Camm | C30B 31/12 392/416 |
| 2003/0114019 | A1* | 6/2003 | Miyauchi | H01L 21/324 438/795 |
| 2003/0183612 | A1* | 10/2003 | Timans | C30B 31/12 219/390 |
| 2007/0084848 | A1* | 4/2007 | Kusuda | C30B 31/12 219/390 |
| 2008/0069550 | A1* | 3/2008 | Timans | C30B 31/12 392/411 |
| 2009/0067823 | A1 | 3/2009 | Kusuda | |
| 2009/0103906 | A1 | 4/2009 | Kusuda | |
| 2009/0120924 | A1* | 5/2009 | Moffatt | B23K 26/0626 219/385 |
| 2009/0166351 | A1* | 7/2009 | Yokomori | H01L 21/2686 219/492 |
| 2011/0227199 | A1* | 9/2011 | Hata | H01L 21/02381 257/616 |
| 2012/0008926 | A1 | 1/2012 | Kusuda | |
| 2013/0043229 | A1 | 2/2013 | Kiyama et al. | 219/200 |
| 2013/0224967 | A1 | 8/2013 | Kusuda | |
| 2014/0212117 | A1 | 7/2014 | Kusuda | |

FOREIGN PATENT DOCUMENTS

| | | |
|---|---|---|
| JP | 2009-099758 | 5/2009 |
| JP | 2009-260018 | 11/2009 |
| JP | 2010-114145 | 5/2010 |
| TW | 2003 06630 | 11/2003 |
| TW | 2009 26302 | 1/2006 |

OTHER PUBLICATIONS

Office on Jun. 19, 2014 in connection with corresponding application PCT/JP2012/076914.
Japanese Office Action dated Sep. 8, 2015 issued in connection with.
Corresponding Japanese application No. 2011-267548 and partial English translation thereof.
Taiwanese Office Action dated Sep. 19, 2014 issued in connection with.
Corresponding Taiwanese application No. 101139358 and partial English translation thereof.
International Search Report mailed Jan. 8, 2013 in corresponding PCT International Application No. PCT/JP2012/076914.

\* cited by examiner

F I G. 3
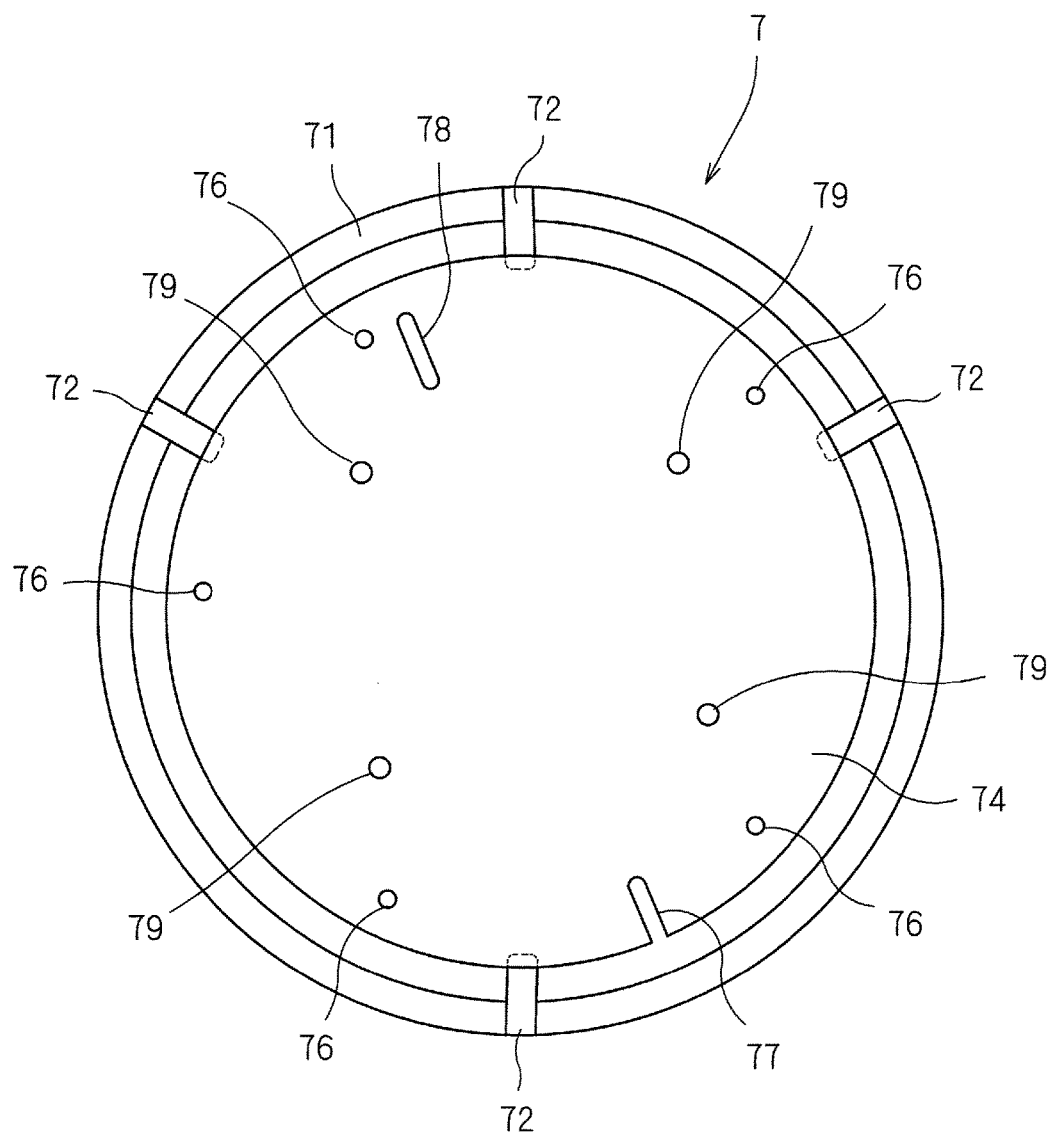

F I G . 4
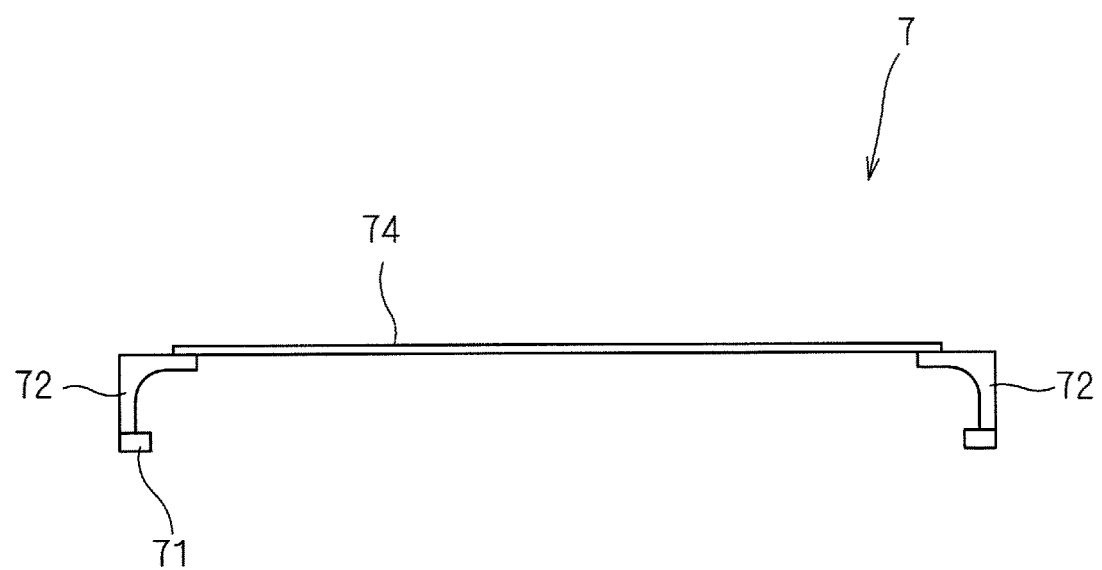

F I G. 5
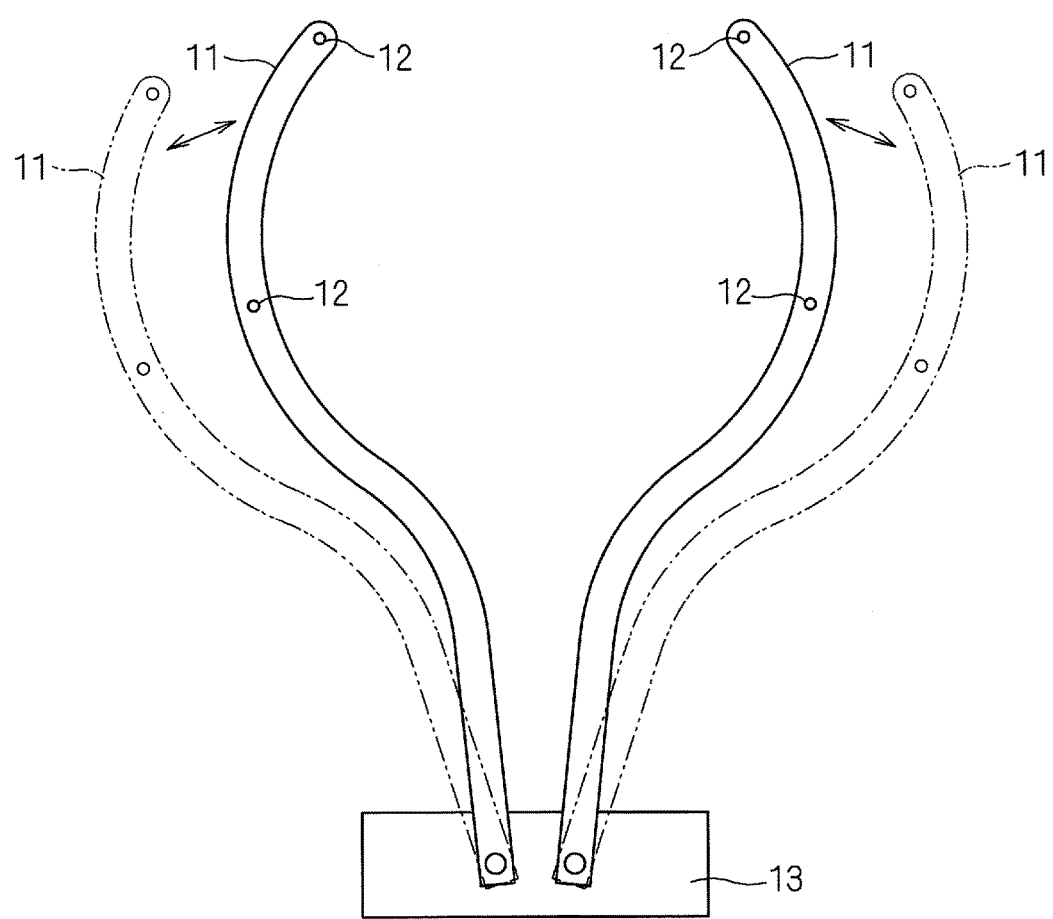

F I G. 6
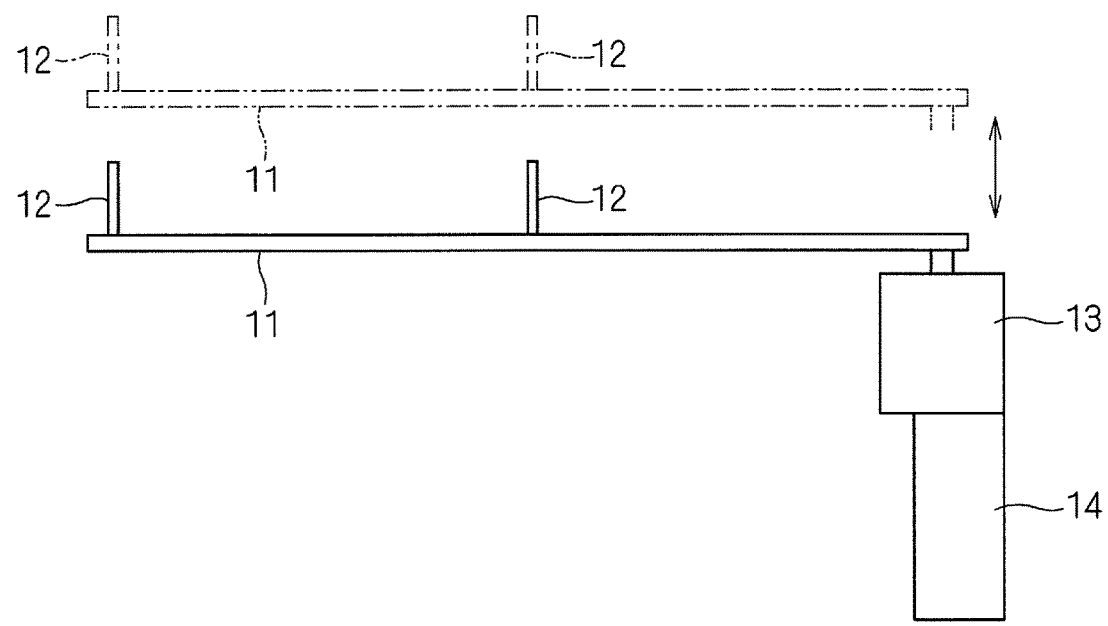

F I G. 7
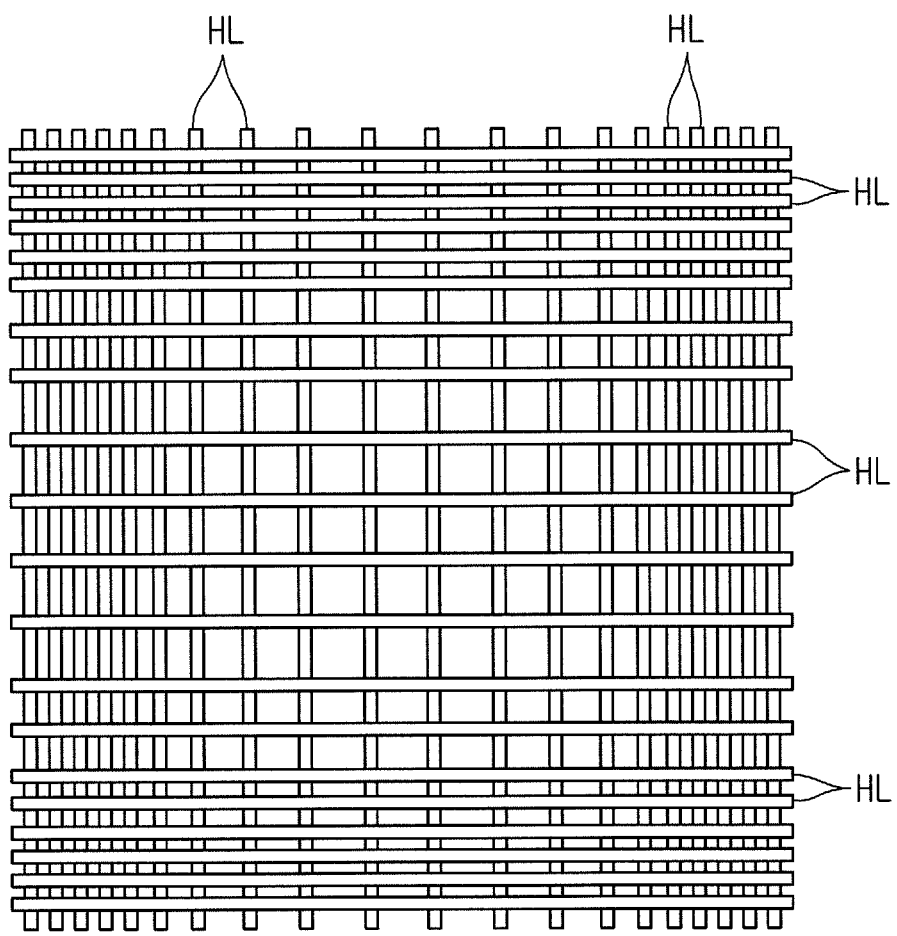

F I G . 1 0
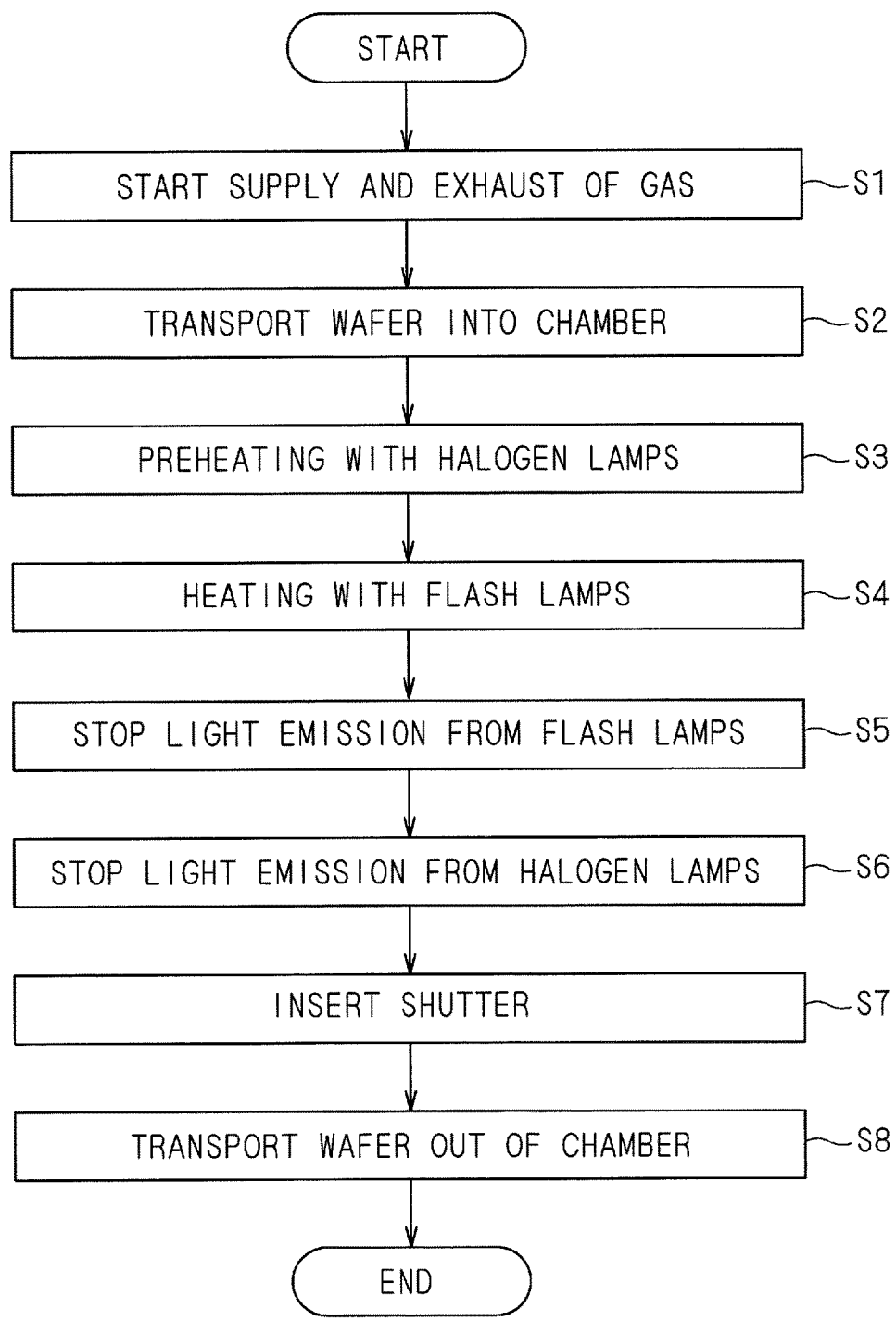

F I G. 1 2 A
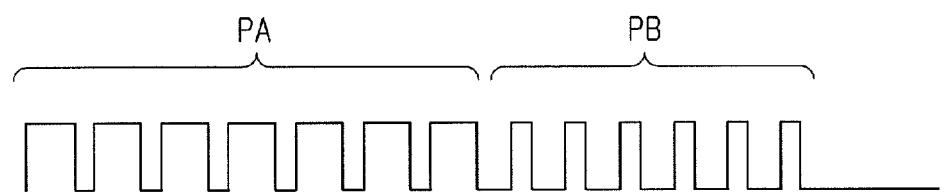
F I G. 1 2 B
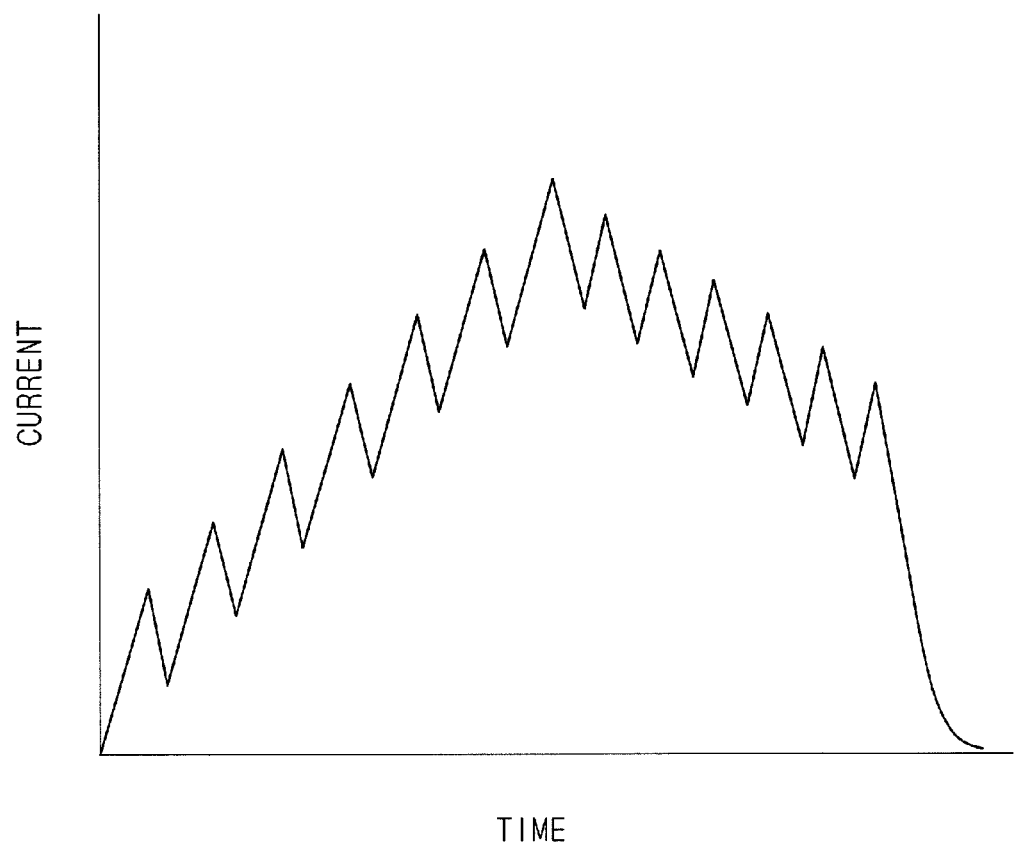

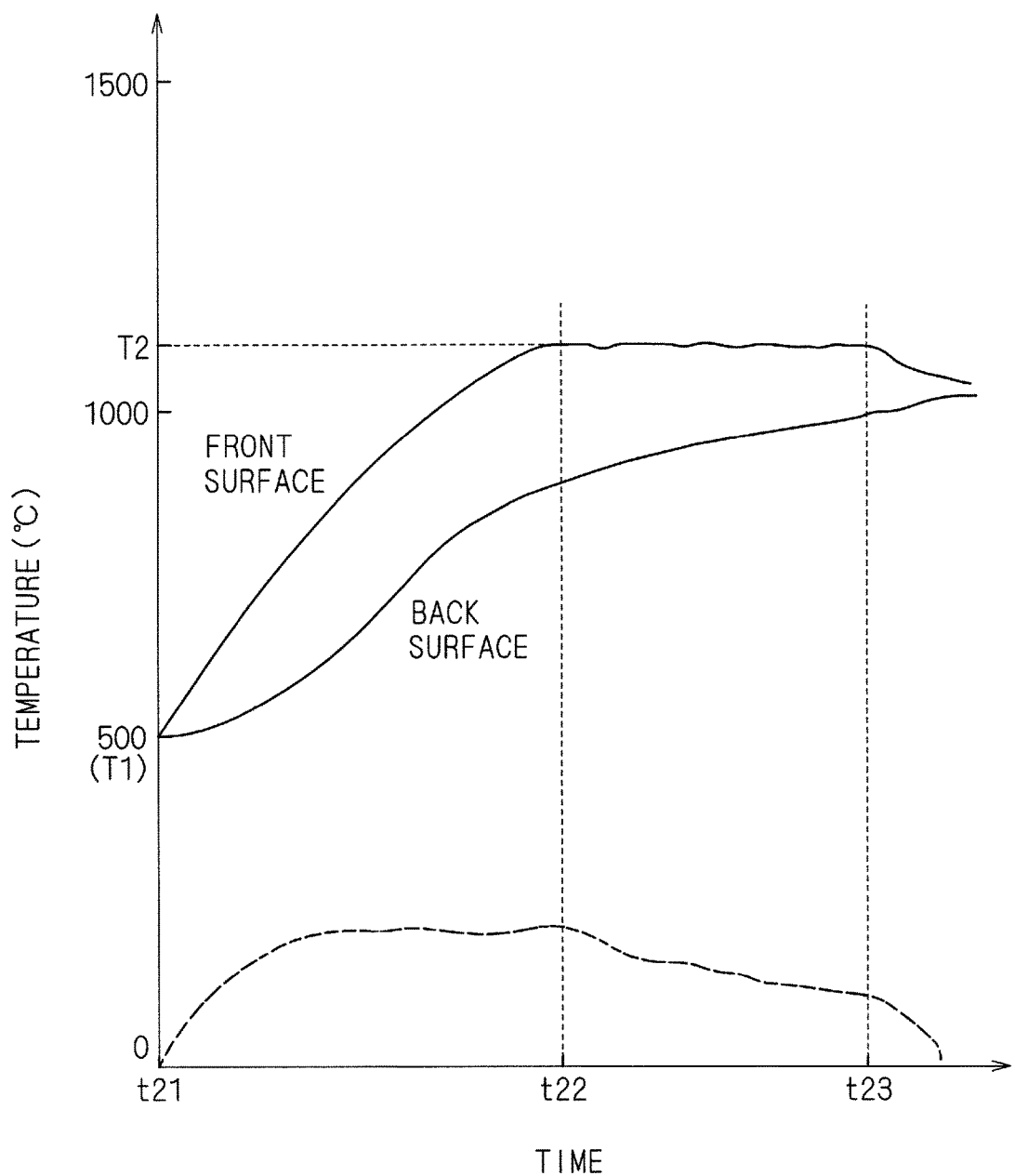

HEAT TREATMENT METHOD AND HEAT TREATMENT APPARATUS

CROSS-REFERENCE TO RELATED APPLICATIONS

The present application is a 35 U.S.C. §§371 national phase conversion of PCT/JP2012/076914, filed Oct. 18, 2012, which claims priority to Japanese Patent Application No. 2011-267548, filed Dec. 7, 2011, the contents of which are incorporated herein by reference. The PCT International Application was published in the Japanese language.

TECHNICAL FIELD

The present invention relates to a heat treatment method and a heat treatment apparatus for heating a thin plate-like precision electronic substrate (hereinafter referred to simply as a "substrate") such as a semiconductor wafer and a glass substrate for a liquid crystal display device by irradiating the substrate with light.

BACKGROUND ART

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ionized impurity elements such as boron (B), arsenic (As) and phosphorus (P) to collide against the semiconductor wafer with high acceleration voltage, thereby physically implanting the impurities into the semiconductor wafer. The implanted impurities are activated by the annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate the surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of the xenon flash lamps is shorter than that of conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

The implantation of high-energy ions by the ion implantation process results in the induction of a large number of defects in silicon crystals of the semiconductor wafer. Such defects are prone to be induced in positions slightly deeper than an ion-implanted layer. During the annealing process subsequent to the ion implantation, it is desirable to perform the recovery of the induced defects as well as the activation of impurities. For such recovery of the defects, the time for annealing process may be made longer. This, however, presents a problem such that the impurities implanted as mentioned above are diffused more deeply than are required.

For this reason, a flash lamp annealing technique which performs additional irradiation with light with a relatively low emission output after a peak of the emission output is passed is disclosed in Japanese Patent Application Laid-Open No. 2009-260018. According to the technique disclosed in Japanese Patent Application Laid-Open No. 2009-260018, the temperature of the front surface of a semiconductor wafer is raised to a treatment temperature, and is thereafter maintained at the treatment temperature for approximately several milliseconds or more by the additional irradiation with light. This allows the heating of the semiconductor wafer in a position slightly deeper than the front surface to some extent, thereby accomplishing not only the activation of the impurities but also the recovery of the induced crystal defects.

SUMMARY OF INVENTION

Technical Problem

In the flash lamp annealing, however, when the temperature of the front surface of the semiconductor wafer is raised to the treatment temperature and is thereafter maintained at the treatment temperature, there is a danger that the frequency of occurrence of wafer cracking increases. This is considered to result from the following reason. In the flash lamp annealing in which the front surface is heated by irradiation for an extremely short time, there inevitably arises a difference in temperature between the front and back surfaces of the semiconductor wafer. Maintaining the temperature of the front surface of the semiconductor wafer at the treatment temperature increases the time period over which there is a large temperature difference between the front and back surfaces, so that stresses resulting from a difference in thermal expansion between the front and back surfaces are concentrated on the back surface of the semiconductor wafer.

The present invention has been made to solve the aforementioned problems. It is therefore an object of the present invention to provide a heat treatment method and a heat treatment apparatus which are capable of heating a substrate to a required temperature by irradiating the substrate with a flash of light while preventing the substrate from cracking.

Solution to Problem

To solve the aforementioned problem, a first aspect of the present invention is intended for a heat treatment method for heating a substrate by irradiating the substrate with light, the heat treatment method comprising: a preheating step for heating a substrate at a predetermined preheating temperature; and a flash heating step for irradiating a first surface of said substrate with a flash of light from a flash lamp to heat said first surface to a target temperature, wherein a flash irradiation time period in said flash heating step is longer than a heat conduction time period required for heat conduction from said first surface to a second surface which is a surface opposite from said first surface, and wherein a difference in temperature between said first and second surfaces in said flash heating step is not more than one-half of an increased temperature from said preheating temperature to said target temperature.

According to a second aspect, in the heat treatment method of the first aspect, a rate of increase in temperature of said first surface in said flash heating step is not less than 1000° C./sec.

According to a third aspect, in the heat treatment method of the first aspect, said substrate is a semiconductor wafer of silicon.

According to a fourth aspect, in the heat treatment method of the first aspect, a switching element intermittently supplies electrical charges from a capacitor to said flash lamp to control an emission output from said flash lamp in said flash heating step.

A fifth aspect is intended for a heat treatment apparatus for heating a substrate by irradiating the substrate with light, the heat treatment apparatus comprising: a chamber for receiving a substrate therein; a holder for holding the substrate within said chamber; a preheating part for heating the substrate held by said holder to a predetermined preheating temperature; a flash lamp for irradiating the substrate held by said holder with a flash of light; and a light emission control part for controlling an emission output from said flash lamp, wherein said light emission control part irradiates a first surface of the substrate held by said holder with a flash of light for a time period longer than a heat conduction time period required for heat conduction from said first surface to a second surface which is a surface opposite from said first surface to heat said first surface to a target temperature, and said light emission control part controls the emission output from said flash lamp so that a difference in temperature between said first and second surfaces is not more than one-half of an increased temperature from said preheating temperature to said target temperature.

According to a sixth aspect, in the heat treatment apparatus of the fifth aspect, said light emission control part controls the emission output from said flash lamp so that the temperature of said first surface increases from said preheating temperature to said target temperature at a temperature increase rate of not less than 1000° C./sec.

According to a seventh aspect, in the heat treatment apparatus of the fifth aspect, said substrate is a semiconductor wafer of silicon.

According to an eighth aspect, in the heat treatment apparatus of the fifth aspect, said light emission control part includes a switching element for intermittently supplying electrical charges from a capacitor to said flash lamp to control the emission output from said flash lamp.

Advantageous Effects of Invention

In the heat treatment method according to the first to fourth aspects, the flash irradiation time period in the flash heating step for irradiating the first surface of the substrate with a flash of light from the flash lamp to heat the first surface to the target temperature is longer than the heat conduction time period required for the heat conduction from the first surface of the substrate to the second surface thereof which is the surface opposite from the first surface, and the difference in temperature between the first and second surfaces in the flash heating step is not more than one-half of the increased temperature from the preheating temperature to the target temperature. This suppresses an excessively large difference in temperature between the front and back surfaces of the substrate to alleviate the concentration of stresses resulting from a difference in thermal expansion between the front and back surfaces. Thus, the substrate is heated to a required temperature by irradiating the substrate with a flash of light while preventing the substrate from cracking.

In the heat treatment apparatus according to the fifth to eighth aspects, the first surface of the substrate held by the holder is irradiated with a flash of light for a time period longer than the heat conduction time period required for the heat conduction from the first surface to the second surface which is the surface opposite from the first surface, so that the first surface is heated to the target temperature. The emission output from the flash lamp is controlled so that the difference in temperature between the first and second surfaces is not more than one-half of the increased temperature from the preheating temperature to the target temperature. This suppresses an excessively large difference in temperature between the front and back surfaces of the substrate to alleviate the concentration of stresses resulting from a difference in thermal expansion between the front and back surfaces. Thus, the substrate is heated to a required temperature by irradiating the substrate with a flash of light while preventing the substrate from cracking.

BRIEF DESCRIPTION OF DRAWINGS

FIG. 3 is a plan view of the holder as seen from the top.

FIG. 4 is a side view of the holder as seen from one side.

FIG. 5 is a plan view of a transfer mechanism.

FIG. 6 is a side view of the transfer mechanism.

FIG. 7 is a plan view showing an arrangement of halogen lamps.

FIG. 10 is a flow diagram showing a procedure for treatment of a semiconductor wafer in the heat treatment apparatus of FIG. 1.

FIGS. 12A and 12B are graphs showing examples of a correlation between the waveform of a pulse signal and a current flowing through a flash lamp.

FIG. 14 is a graph showing an example of temperature profiles of the front and back surfaces of a semiconductor wafer.

DESCRIPTION OF EMBODIMENTS

An embodiment according to the present invention will now be described in detail with reference to the drawings.

Figure 1:
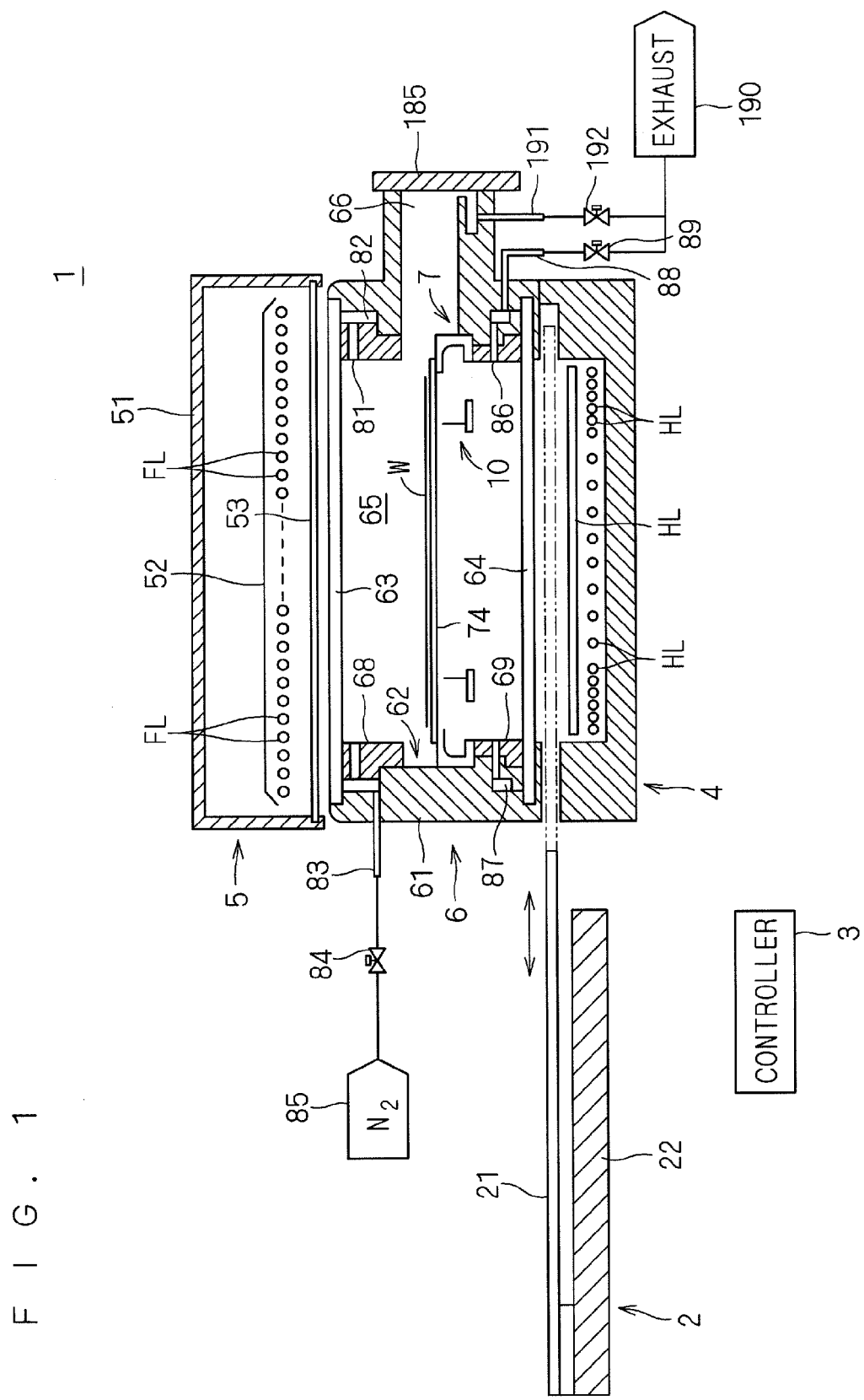
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 according to the present embodiment is a flash lamp annealer for irradiating a disk-shaped silicon semiconductor wafer W having a diameter of 300 mm and serving as a substrate with a flash of light to heat the semiconductor wafer W. A semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that chamber windows made of quartz are mounted to the top and bottom of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

A reflective ring 68 is mounted to an upper portion of the inner wall surface of the chamber side portion 61, and a reflective ring 69 is mounted to a lower portion thereof. Both of the reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the reflective rings 68 and 69 are removably mounted to the chamber side portion 61. An interior space of the chamber 6, i.e. a space surrounded by the upper chamber window 63, the lower chamber window 64, the chamber side portion 61, and the reflective rings 68 and 69, is defined as a heat treatment space 65.

A recessed portion 62 is defined in the inner wall surface of the chamber 6 by mounting the reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the reflective ring 68, and an upper end surface of the reflective ring 69. The recessed portion 62 is provided in the form of a horizontal annular ring in the inner wall surface of the chamber 6, and surrounds the holder 7 which holds a semiconductor wafer W.

The chamber side portion 61 and the reflective rings 68 and 69 are made of a metal material (e.g., stainless steel) with high strength and high heat resistance. The inner peripheral surfaces of the reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas (in the present embodiment, nitrogen gas ($N_2$)) therethrough into the heat treatment space 65 is provided in an upper portion of the inner wall of the chamber 6. The gas supply opening 81 is provided above the recessed portion 62, and may be provided in the reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
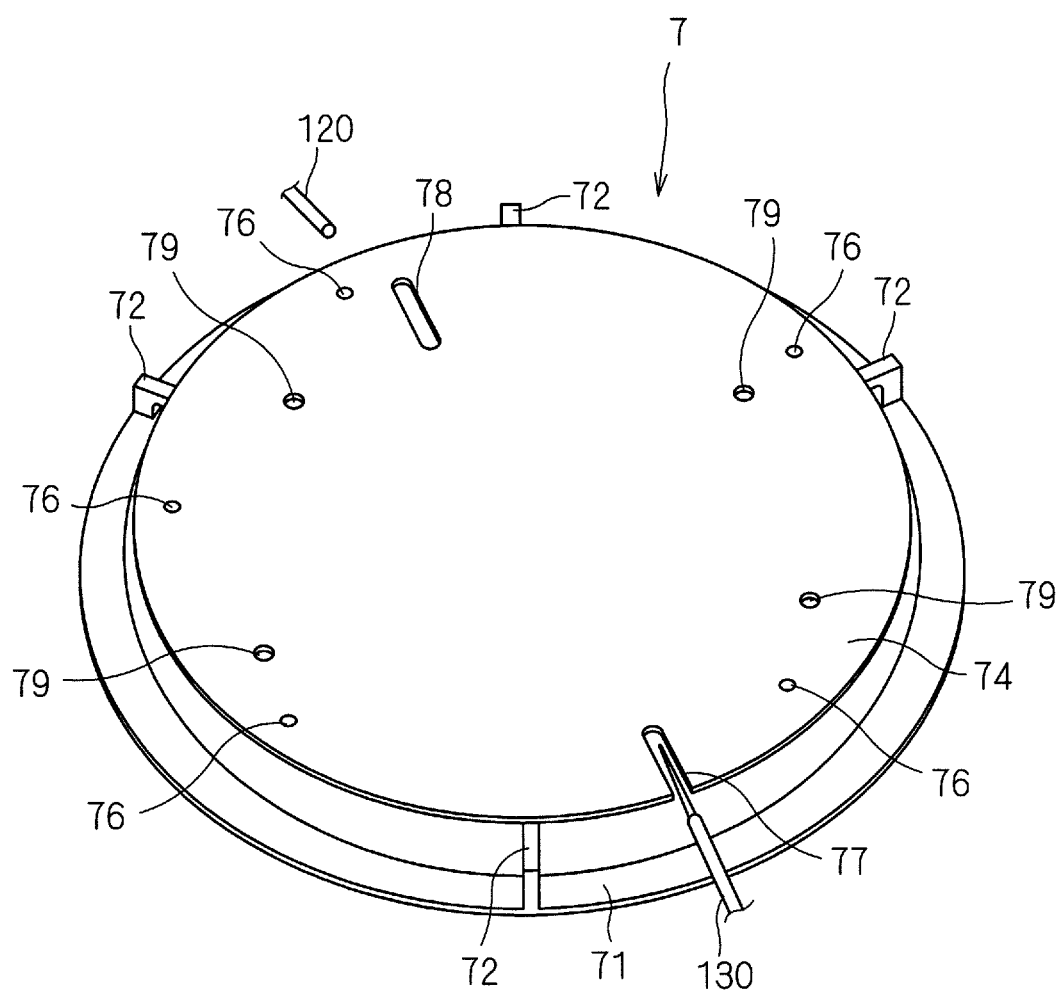
FIG. 2 is a perspective view showing the entire external appearance of a holder.

FIG. 2 is a perspective view showing the entire external appearance of the holder 7. FIG. 3 is a plan view of the holder 7 as seen from the top. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in the present embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The planar susceptor 74 is supported by the four coupling portions 72 provided on the base ring 71. The susceptor 74 is a generally circular planar member made of quartz. The diameter of the susceptor 74 is greater than that of a semiconductor wafer W. In other words, the susceptor 74 has a size, as seen in plan view, greater than that of the semiconductor wafer W. Multiple (in the present embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal attitude (an attitude such that the normal to the susceptor 74 coincides with a vertical direction). A semiconductor wafer W transported into the chamber 6 is placed and held in a horizontal attitude on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be any number that can prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

FIG. 5 is a plan view of the transfer mechanism 10. FIG. 6 is a side view of the transfer mechanism 10. The transfer mechanism 10 includes two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes a light source provided inside an enclosure 51 and including the multiple (in the present embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51 of the flash heating part 5. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

Figure 8:
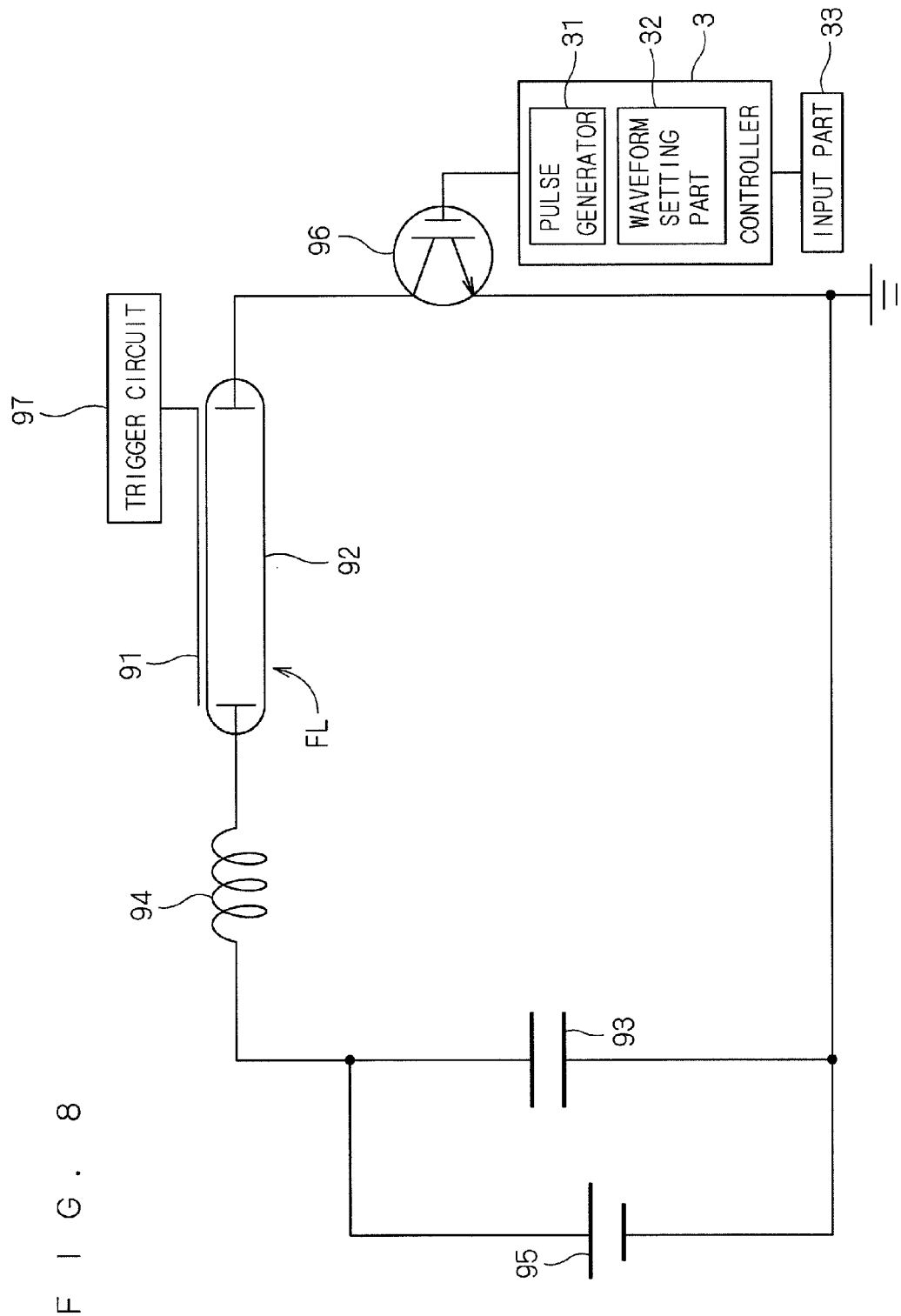
FIG. 8 is a diagram showing a driving circuit for a flash lamp.

FIG. 8 is a diagram showing a driving circuit for each flash lamp FL. As illustrated in FIG. 8, a capacitor 93, a coil 94, a flash lamp FL, and an IGBT (insulated-gate bipolar transistor) 96 are connected in series. Also as shown in FIG. 8, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33, and the pulse generator 31 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (Metal Oxide Semiconductor Field effect transistor) incorporated in the gate portion thereof, and is also a switching element suitable for handling a large amount of power. The pulse generator 31 in the controller 3 applies the pulse signal to the gate of the IGBT 96. When a voltage ("High" voltage) not less than a predetermined level is applied to the gate of the IGBT 96, the IGBT 96 turns on. When a voltage ("Low" voltage) less than the predetermined level is applied to the gate of the IGBT 96, the IGBT 96 turns off. In this manner, the driving circuit including the flash lamp FL is turned on and off by the IGBT 96. By turning the IGBT 96 on and off, a connection between the flash lamp FL and the capacitor 93 corresponding thereto is made and broken.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, when the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

Also, the reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a satin finish thereon.

The multiple (in the present embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In the present embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light, and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 8, the controller 3 includes the pulse generator 31 and the waveform setting part 32. As mentioned earlier, the waveform setting part 32 sets the waveform of the pulse signal, based on an input from the input part 33, and the pulse generator 31 outputs the pulse signal to the gate of the IGBT 96 in accordance with the waveform. The controller 3 and the IGBT 96 constitute a light emission control means for controlling an emission output from each flash lamp FL.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 9:
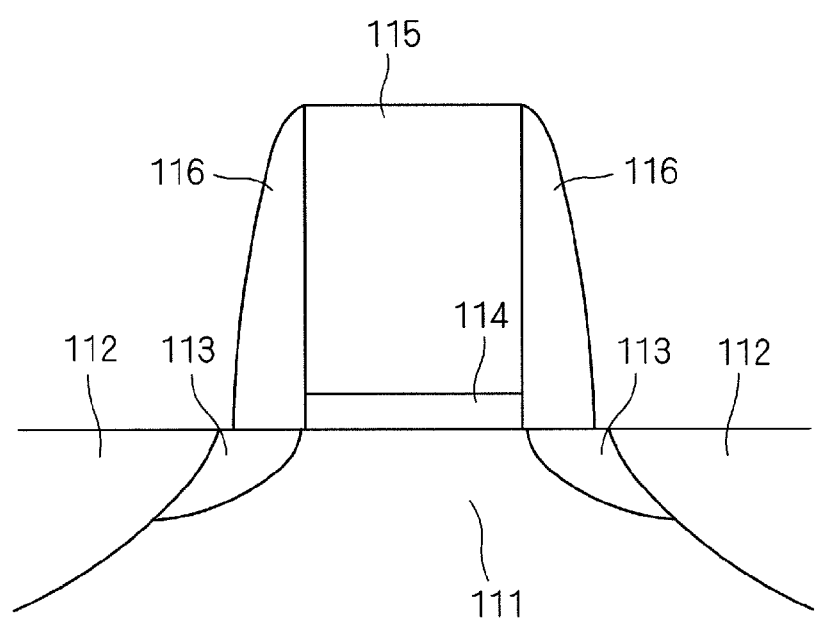
FIG. 9 is a view showing a structure of an element formed on a semiconductor wafer to be treated in the heat treatment apparatus of FIG. 1.

Next, a procedure for the treatment of a semiconductor wafer W in the heat treatment apparatus 1 will be described. A semiconductor wafer W to be treated in the present embodiment is a semiconductor substrate doped with impurities (ions) by an ion implantation process. FIG. 9 is a view showing a structure of an element formed on a semiconductor wafer W to be treated in the heat treatment apparatus 1. Source/drain regions 112 and extension regions 113 are formed in a silicon substrate 111, and a gate electrode 115 is provided on the upper surface of the silicon substrate 111. The extension regions 113 are electrical connections between the source/drain regions 112 and a channel. The gate electrode 115 made of metal is provided on the silicon substrate 111, with a gate insulation film 114 therebetween. Side walls 116 made of SiN are formed on the sides of the gate electrode 115. The source/drain regions 112 and the extension regions 113 are doped with impurities by an ion implantation process, and the impurities are activated by the heat treatment apparatus 1 performing the process of heating (annealing) by irradiation with light. The procedure for the treatment in the heat treatment apparatus 1 which will be described below proceeds under the control of the controller 3 over the operating mechanisms of the heat treatment apparatus 1.

FIG. 10 is a flow diagram showing a procedure for the treatment of a semiconductor wafer W in the heat treatment apparatus 1. First, the valve 84 for supply of gas is opened, and the valves 89 and 192 for exhaust of gas are opened, so that the supply and exhaust of gas into and out of the chamber 6 start (Step S1). When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with the process steps of FIG. 10.

Subsequently, the gate valve 185 is opened to open the transport opening 66. A transport robot outside the heat treatment apparatus 1 transports a semiconductor wafer W implanted with impurities through the transport opening 66 into the heat treatment space 65 in the chamber 6 (Step S2). The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude. The semiconductor wafer W is held on the susceptor 74 so that the front surface thereof which is patterned and implanted with impurities is the upper surface. Also, the semiconductor wafer W is held inside the five guide pins 76 on the upper surface of the susceptor 74. The pair of transfer arms 11 moved downwardly below the susceptor 74 is moved back to the retracted position, i.e. to the inside of the recessed portion 62, by the horizontal movement mechanism 13.

After the semiconductor wafer W is placed and held on the susceptor 74 of the holder 7, the 40 halogen lamps HL in the halogen heating part 4 turn on simultaneously to start preheating (or assist-heating) (Step S3). Halogen light emitted from the halogen lamps HL is transmitted through the lower chamber window 64 and the susceptor 74 both made of quartz, and impinges upon the back surface (a main surface opposite from the front surface) of the semiconductor wafer W. The semiconductor wafer W is irradiated with the light from the halogen lamps HL, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

Figure 11:
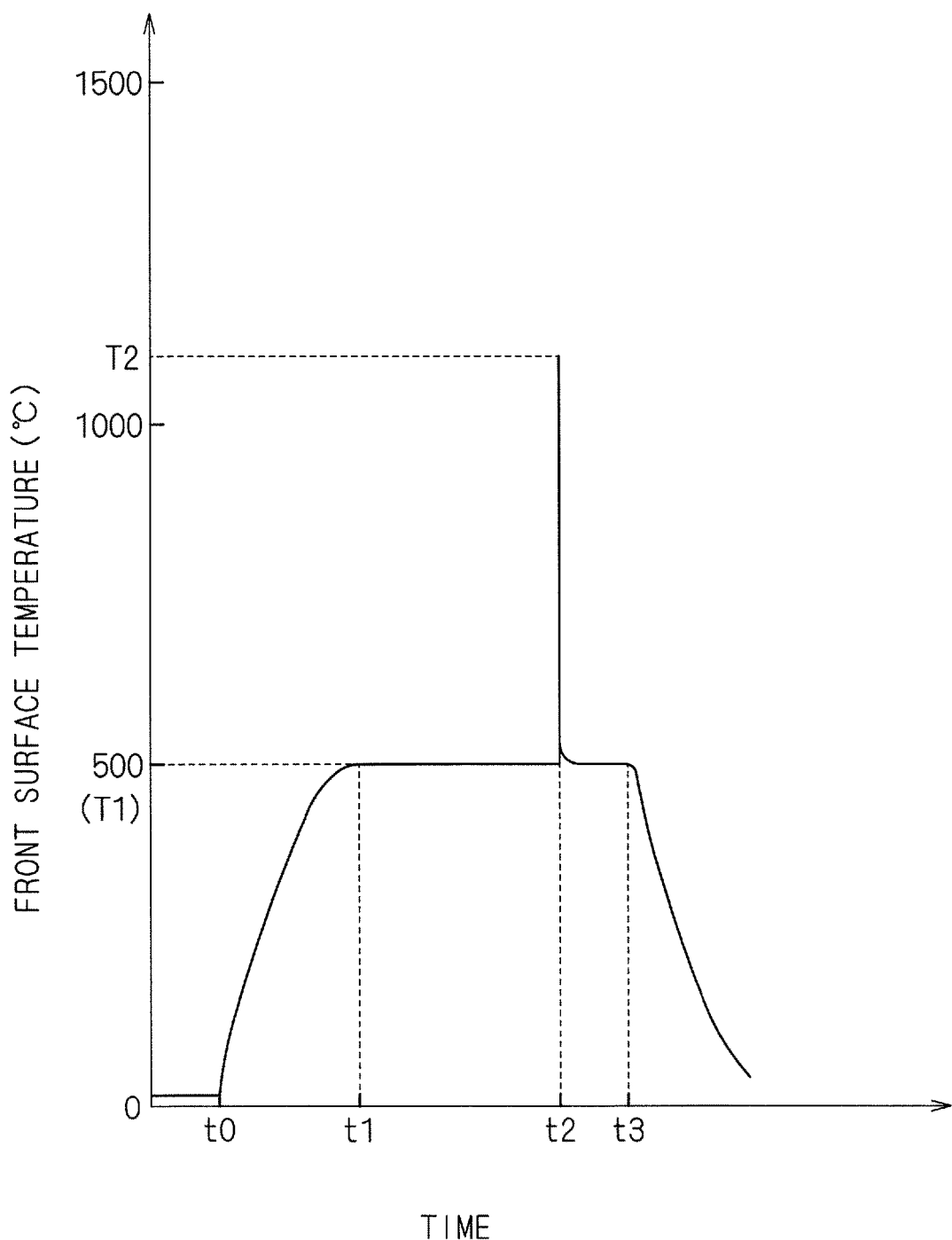
FIG. 11 is a graph showing changes in the temperature of the front surface of a semiconductor wafer.

FIG. 11 is a graph showing changes in the temperature of the front surface of the semiconductor wafer W. After the semiconductor wafer W is transported into the heat treatment space 65 and is placed on the susceptor 74, the controller 3 turns on the 40 halogen lamps HL at time t0, so that the temperature of the semiconductor wafer W irradiated with the halogen light is increased to a preheating temperature T1. The preheating temperature T1 is in the range of 300° to 800° C., and shall be 500° C. in the present embodiment.

The temperature of the semiconductor wafer W is measured with the contact-type thermometer 130 when the halogen lamps HL perform preheating. Specifically, the contact-type thermometer 130 incorporating a thermocouple comes through the notch 77 into contact with the lower surface of the semiconductor wafer W held by the susceptor 74 to measure the temperature of the wafer which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 effects feedback control of the output from the halogen lamps HL, based on the value measured with the contact-type thermometer 130, so that the temperature of the semiconductor wafer W is equal to the preheating temperature T1. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

After the temperature of the semiconductor wafer W reaches the preheating temperature T1, the controller 3 maintains the temperature of the semiconductor wafer W at the preheating temperature T1 for a short time. Specifically, at time t1 when the temperature of the semiconductor wafer W measured with the contact-type thermometer 130 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform a heating treatment at time t2 when a predetermined time period has elapsed since the temperature of the semiconductor wafer W reached the preheating temperature T1 (Step S4). It should be noted that a time period required for the temperature of the semiconductor wafer W at room temperature to reach the preheating temperature T1 (a time interval between the time t0 and the time t1) is only on the order of several seconds, and that a time period required between the instant at which the temperature of the semiconductor wafer W reaches the preheating temperature T1 and the instant at which the flash lamps FL emit light (a time interval between the time t1 and the time t2) is also only on the order of several seconds. For flash irradiation from a flash lamp FL, the capacitor 93 is charged in advance by the power supply unit 95. Then, with the capacitor 93 in the charged state, the pulse generator 31 in the controller 3 outputs a pulse signal to the IGBT 96 to drive the IGBT 96 on and off.

FIGS. 12A and 12B are graphs showing examples of a correlation between the waveform of the pulse signal and a current flowing through a flash lamp FL. The pulse signal having a waveform as shown in FIG. 12A is herein outputted from the pulse generator 31. The waveform of the pulse signal is specified by inputting from the input part 33 a recipe that is a sequence of defined parameters including a time interval (ON time) equivalent to the pulse width and a time interval (OFF time) between pulses. After an operator inputs such a recipe from the input part 33 to the controller 3, the waveform setting part 32 in the controller 3 sets a pulse waveform having repeated ON and OFF time intervals as shown in FIG. 12A in accordance with the recipe. Pulses PA which are relatively long in pulse width and short in time intervals therebetween are set in an early part of the pulse waveform shown in FIG. 12A, and pulses PB which are relatively short in pulse width and long in time intervals therebetween are set in a late part thereof. Then, the pulse generator 31 outputs the pulse signal in accordance with the pulse waveform set by the waveform setting part 32. As a result, the pulse signal having the waveform as shown in FIG. 12A is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the pulse signal outputted from the pulse generator 31, the controller 3 controls the trigger circuit 97 to apply a high voltage (trigger voltage) to the trigger electrode 91. The pulse signal is inputted to the gate of the IGBT 96, with the electrical charges stored in the capacitor 93, and the high voltage is applied to the trigger electrode 91 in synchronism with the turning on of the pulse signal, whereby a current flows across the electrodes of the glass tube 92 whenever the pulse signal is on. The resultant excitation of xenon atoms or molecules induces light emission.

The pulse signal having the waveform shown in FIG. 12A is outputted from the controller 3 to the gate of the IGBT 96, and the high voltage is applied to the trigger electrode 91 in synchronism with the turning on of the pulse signal, whereby a current having a waveform as shown in FIG. 12B flows through the circuit including the flash lamp FL. Specifically, the value of the current flowing in the glass tube 92 of the flash lamp FL increases when the pulse signal inputted to the gate of the IGBT 96 is on, and decreases when the pulse signal is off. It should be noted that an individual current waveform corresponding to each pulse is defined by the constant of the coil 94.

Figure 13:
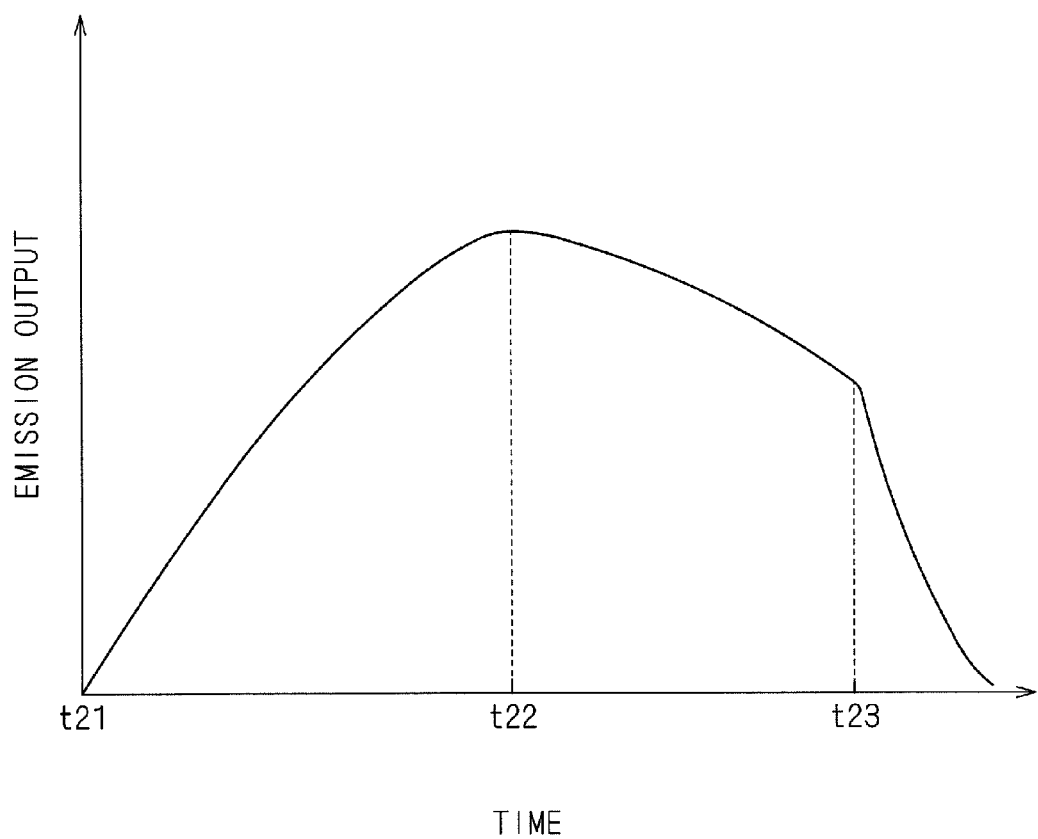
FIG. 13 is a graph showing an example of an emission output profile of a flash lamp.

The current having the waveform shown in FIG. 12B flows, so that the flash lamp FL emits light. The emission output from the flash lamp FL is roughly proportional to the current flowing through the flash lamp FL. Thus, the output waveform (profile) of the emission output from the flash lamp FL has a pattern as shown in FIG. 13. The front surface of the semiconductor wafer W held by the holder 7 is irradiated with flashes of light in accordance with the output waveform from the flash lamp FL as shown in FIG. 13.

If the flash lamp FL emits light without using the IGBT 96, the electrical charges stored in the capacitor 93 are consumed by emitting light only once, so that the output waveform from the flash lamp FL exhibits a single pulse on the order of 0.1 to 10 milliseconds. On the other hand, the IGBT 96 serving as a switching element is connected in the circuit and the pulse signal as shown in FIG. 12A is outputted to the gate of the IGBT 96 according to the present embodiment. Thus, the IGBT 96 intermittently supplies the electrical charges from the capacitor 93 to the flash lamp FL to control the current flowing to the flash lamp FL. As a result, the light emission from the flash lamp FL is accordingly chopper-controlled, which allows the electrical charges stored in the capacitor 93 to be consumed in a divided manner. This enables the flash lamp FL to repeatedly flash on and off in an extremely short time. It should be noted that, before the value of the current reaches exactly zero, the next pulse is applied to the gate of the IGBT 96 to increase the current value again, as shown in FIG. 12B. For this reason, the emission output never reaches exactly zero even while the flash lamp FL repeatedly flashes on and off.

The output waveform of light shown in FIG. 13 may be regarded to show that two-stage irradiation with light is performed. Specifically, the two-stage irradiation is performed which includes: first irradiation from time t21 at which the flash lamp FL starts emitting light to time t22 at which the emission output is at its maximum; and second irradiation from the time t22 to time t23 during which the emission output decreases gradually.

More specifically, the pulse generator 31 first intermittently applies the pulses PA which are relatively long in pulse width and short in time intervals therebetween to the gate of the IGBT 96 to cause the IGBT 96 to repeatedly turn on and off, whereby a current flows through the circuit including the flash lamp FL. At this stage, because the pulses PA which are relatively long in pulse width and short in time intervals therebetween are applied to the gate of the IGBT 96, the ON time of the IGBT 96 is longer than the OFF time thereof, so that the current flowing through the flash lamp FL has a sawtooth waveform which increases as seen in general view (an early part of FIG. 12B. The flash lamp FL through which the current having such a waveform flows performs the first irradiation such that the emission output increases from the time t21 to the time t22.

Next, the pulse generator 31 intermittently applies the pulses PB which are relatively short in pulse width and long in time intervals therebetween to the gate of the IGBT 96. At this stage, because the pulses PB which are relatively short in pulse width and long in time intervals therebetween are applied to the gate of the IGBT 96, the ON time of the IGBT 96 is shorter than the OFF time thereof in a manner contrary to the above, so that the current flowing through the flash lamp FL has a sawtooth waveform which decreases gradually as seen in general view (a late part of FIG. 12B. The flash lamp FL through which the current having such a waveform flows performs the second irradiation such that the emission output decreases gradually from the time t22 to the time t23.

By performing the two-stage flash irradiation as shown in FIG. 13 on the front surface of the semiconductor wafer W, the temperature of the front surface of the semiconductor wafer W increases from the preheating temperature T1 to a target temperature T2, so that the heating treatment of the front surface is performed. FIG. 14 is a graph showing an example of temperature profiles of the front and back surfaces of the semiconductor wafer W. In FIG. 14, the temperature profiles of the front and back surfaces are indicated by solid lines, and a profile of the temperature difference between the front and back surfaces is indicated by a dotted line.

First, the first irradiation from the time t21 to the time t22 causes the temperature of the front surface of the semiconductor wafer W to increase from the preheating temperature T1 to the target temperature T2. The target temperature T2 is in the range of 1000° to 1400° C. where the activation of the implanted impurities is achieved, and shall be 1100° C. in the present embodiment. The rate of temperature increase (the rate of increase in the temperature of the front surface) at the time that the temperature of the front surface of the semiconductor wafer W is increased to the target temperature T2 by the first irradiation from the time t21 to the time t22 is not less than 1000° C./sec. Next, the second irradiation from the time t22 to the time t23 maintains the temperature of the front surface of the semiconductor wafer W within a ±25° C. range around the target temperature T2 for a predetermined time period.

A flash irradiation time period in the flash heating step in Step S4, i.e. a time interval between the time t21 at which the flash irradiation is started and the time t23 at which the flash irradiation is finished, is longer than a heat conduction time period from the front surface of the semiconductor wafer W to the back surface thereof. The "heat conduction time period" as that term is used herein refers to a time period required for the heat generated at the front surface of the semiconductor wafer W by flash irradiation to be conducted to the back surface thereof. The heat conduction time period is determined by the material and outer size of the semiconductor wafer W, and is approximately 15 milliseconds for a silicon wafer having a diameter of 300 mm (and having a standardized thickness of 0.775 mm) as used in the present embodiment. That is, in the flash heating step in Step S4, the front surface of the semiconductor wafer W is flash heated to the target temperature T2 by flash irradiation over a time period of not less than 15 milliseconds which is longer than the heat conduction time period required for heat conduction from the front surface of the semiconductor wafer W to the back surface thereof.

The heat generated at the front surface of the semiconductor wafer W by the flash irradiation is conducted to the back surface thereof, so that the temperature of the back surface also increases gradually. In the flash heating which causes the temperature of the front surface of the semiconductor wafer W to increase abruptly at not less than 1000° C./sec, there arises a difference in temperature between the front and back surfaces because the temperature of the back surface is increased later by the heat conduction from the front surface after the temperature of the front surface is increased earlier. The difference in temperature between the front and back surfaces of the semiconductor wafer W in the flash heating step in Step S4 is controlled to be not more than one-half of the increased temperature (jump temperature) from the preheating temperature T1 to the target temperature T2. The difference in temperature between the front and back surfaces of the semiconductor wafer W is controlled to be always not more than one-half of the increased temperature throughout the flash heating step, i.e. during the time interval that the flash irradiation is performed between the time t21 and the time t23. In the present embodiment, the difference in temperature between the front and back surfaces of the semiconductor wafer W in the flash heating step is controlled to be not more than 300° C. because the increased temperature from the preheating temperature T1=500° C. to the target temperature T2=1100° C. is 600° C.

Specifically, the IGBT 96 controls the passage of current to the flash lamp FL so as to perform the flash irradiation on the front surface of the semiconductor wafer W over a time period longer than the heat conduction time period required for the heat conduction from the front surface of the semiconductor wafer W to the back surface thereof to heat the wafer front surface to the target temperature T2. Also, the IGBT 96 controls the passage of current to the flash lamp FL so that the temperature of the front surface of the semiconductor wafer W is increased at a temperature increase rate of not less than 1000° C./sec from the preheating temperature T1 to the target temperature T2. Further, the IGBT 96 controls the passage of current to the flash lamp FL so that the difference in temperature between the front and back surfaces of the semiconductor wafer W is always not more than one-half of the increased temperature from the preheating temperature T1 to the target temperature T2 throughout a time period over which the flash lamp FL performs the flash irradiation. It should be noted that the graph of FIG. 11 is plotted with a time scale of seconds, whereas the graph of FIG. 14 is plotted with a time scale of milliseconds. Thus, the times t21 to t23 in FIG. 14 are shown as overlaid on the time t2 in FIG. 11.

After the second irradiation using the flash lamp FL is completed, the IGBT 96 turns off to stop the light emission from the flash lamp FL (Step S5). Then, the temperature of the front surface of the semiconductor wafer W decreases from the target temperature T2. At this time, the temperature of the front surface of the semiconductor wafer W becomes equal to the temperature of the back surface thereof. Referring again to FIG. 11, the halogen lamps HL turn off at time t3 which is a predetermined time period later than the completion of the second irradiation (Step S6). This causes the temperature of the semiconductor wafer W to start decreasing from the preheating temperature T1. At the same time that the halogen lamps HL turn off, the shutter mechanism 2 inserts the shutter plate 21 into the light shielding position lying between the halogen heating part 4 and the chamber 6 (Step S7). The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases.

At the time of the insertion of the shutter plate 21 into the light shielding position, the radiation thermometer 120 starts measuring the temperature. Specifically, the radiation thermometer 120 measures the intensity of infrared radiation emitted from the lower surface of the semiconductor wafer W held by the holder 7 through the opening 78 of the susceptor 74 to measure the temperature of the semiconductor wafer W which is on the decrease. The measured temperature of the semiconductor wafer W is transmitted to the controller 3.

Some radiant light is continuously emitted from the halogen lamps HL at elevated temperature immediately after the turning off. The radiation thermometer 120, however, measures the temperature of the semiconductor wafer W when the shutter plate 21 is inserted in the light shielding position. Thus, the radiant light directed from the halogen lamps HL toward the heat treatment space 65 of the chamber 6 is interrupted. This allows the radiation thermometer 120 to precisely measure the temperature of the semiconductor wafer W held by the susceptor 74 without being influenced by disturbance light.

The controller 3 monitors whether the temperature of the semiconductor wafer W measured with the radiation thermometer 120 is decreased to a predetermined temperature or not. After the temperature of the semiconductor wafer W is decreased to the predetermined temperature or below, the pair of transfer arms 11 of the transfer mechanism 10 is moved horizontally again from the retracted position to the transfer operation position and is then moved upwardly, whereby the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside (Step S8). Thus, the heat treatment apparatus 1 completes the heating treatment of the semiconductor wafer W.

In the present embodiment, the pulses PA which are relatively long in pulse width and short in time intervals therebetween are intermittently applied to the gate of the IGBT 96, whereby the first irradiation which increases the emission output from the flash lamp FL from zero to a maximum value is performed. Such first irradiation causes the temperature of the front surface of the semiconductor wafer W to increase from the preheating temperature T1 to the target temperature T2. The rate of increase in the temperature of the front surface of the semiconductor wafer W at this time is not less than 1000° C./sec.

Subsequently, the pulses PB which are relatively short in pulse width and long in time intervals therebetween are intermittently applied to the gate of the IGBT 96, whereby the second irradiation which gradually decreases the emission output from the flash lamp FL from the maximum value is performed. Such second irradiation maintains the temperature of the front surface of the semiconductor wafer W within a ±25° C. range around the target temperature T2 for a predetermined time period.

The time required for the activation of the implanted impurities is extremely short, and the activation of the impurities is momentarily achieved by the flash heating which increases the temperature of the front surface of the semiconductor wafer W to the target temperature T2. Also, recovery of point defects induced in the semiconductor wafer W during the implantation of the impurities is achieved by maintaining the temperature of the front surface of the semiconductor wafer W near the target temperature T2 for a predetermined time period.

Also in the present embodiment, the flash irradiation time period in the flash heating step is made longer than the heat conduction time period required for the heat conduction from the front surface of the semiconductor wafer W to the back surface thereof, and the difference in temperature between the front and back surfaces of the semiconductor wafer W is controlled to be always not more than one-half of the increased temperature from the preheating temperature T1 to the target temperature T2 during the flash irradiation. This suppresses an excessively large difference in temperature between the front and back surfaces of the semiconductor wafer W in the flash heating step to alleviate the concentration of stresses on the wafer back surface resulting from a difference in thermal expansion between the front and back surfaces. As a result, the cracking of the semiconductor wafer W during the flash heating is prevented.

While the embodiment according to the present invention has been described hereinabove, various modifications of the present invention in addition to those described above may be made without departing from the scope and spirit of the invention. For example, in the aforementioned embodiment, the two-stage flash irradiation causes the temperature of the front surface of the semiconductor wafer W to be increased to the target temperature T2 and then to be maintained near the target temperature T2 for a predetermined time period. However, the temperature profile of the front surface temperature is not limited to such a pattern. For example, the temperature of the front surface of the semiconductor wafer W may be increased from the preheating temperature T1 to the target temperature T2 for a time period longer than the heat conduction time period, and the light emission from the flash lamps FL may be stopped to decrease the temperature of the front surface at the same time that the temperature of the front surface of the semiconductor wafer W reaches the target temperature T2. Alternatively, the temperature of the front surface of the semiconductor wafer W may be increased to the target temperature T2 for a time period shorter than the heat conduction time period, and the flash irradiation may be subsequently continued without interruption to perform the heating treatment of the front surface of the semiconductor wafer W.

That is, the present invention allows any profile of the front surface temperature of the semiconductor wafer W, so long as the flash irradiation time period in the entire flash heating step is longer than the heat conduction time period required for the heat conduction from the front surface of the semiconductor wafer W to the back surface thereof and so long as the difference in temperature between the front and back surfaces of the semiconductor wafer W is always not more than one-half of the increased temperature from the preheating temperature T1 to the target temperature T2 during the flash irradiation.

Although the heat treatment is performed by irradiating the front surface of the semiconductor wafer W with a flash of light in the aforementioned embodiment, the back surface of the semiconductor wafer W may be irradiated with a flash of light. Specifically, after the semiconductor wafer W is inverted or flipped upside down and then held by the holder 7 (i.e., held, with the front surface positioned to face downward), the treatment similar to that described in the aforementioned embodiment may be performed. Also, the heat treatment apparatus may be configured such that the halogen heating part 4 is disposed over the chamber 6 whereas the flash heating part 5 is disposed under the chamber 6, and may perform the flash heating treatment. Even when the flash irradiation is performed on the back surface of the semiconductor wafer W, it is only necessary that the flash irradiation time period in the entire flash heating step is longer than the heat conduction time period and that the difference in temperature between the front and back surfaces of the semiconductor wafer W is always not more than one-half of the increased temperature from the preheating temperature T1 to the target temperature T2 during the flash irradiation. This suppresses an excessively large difference in temperature between the front and back surfaces of the semiconductor wafer W during the flash heating to alleviate the concentration of stresses on the wafer front surface resulting from a difference in thermal expansion between the front and back surfaces. As a result, the cracking of the semiconductor wafer W is prevented.

After all, it is only necessary to irradiate a first surface of the semiconductor wafer W with a flash of light from the flash lamps FL so that the flash irradiation time period is longer than the heat conduction time period required for the heat conduction from the first surface of the semiconductor wafer W to a second surface thereof which is a main surface opposite from the first surface and so that the difference in temperature between the first and second surfaces of the semiconductor wafer W is always not more than one-half of the increased temperature from the preheating temperature T1 to the target temperature T2 during the flash irradiation. This suppresses an excessively large difference in temperature between the front and back surfaces of the semiconductor wafer W during the flash heating to alleviate the concentration of stresses on the first surface (or the second surface) of the wafer resulting from a difference in thermal expansion between the front and back surfaces, thereby preventing the cracking of the semiconductor wafer W.

Also, the process for setting the waveform of the pulse signal is not limited to inputting the parameters including the pulse width and the like one by one from the input part 33. For example, the setting of the waveform may be done by an operator inputting the waveform directly in graphical form from the input part 33, by reading the waveform previously set and stored in a storage part such as a magnetic disk and the like, or by downloading the waveform from outside the heat treatment apparatus 1.

Further, although the voltage is applied to the trigger electrode 91 in synchronism with the turning on of the pulse signal in the aforementioned embodiment, the timing of the application of the trigger voltage is not limited to this. The trigger voltage may be applied at fixed time intervals independently of the waveform of the pulse signal. In a case where the pulse signal is short in time intervals or where the passage of current is started by a pulse while the value of the current caused to flow through the flash lamp FL by the preceding pulse is not less than a predetermined value, the current continues to flow through the flash lamp FL without interruption. In such a case, it is not necessary to apply the trigger voltage for each pulse. In a case where all of the pulse intervals of the pulse signal are shorter than a predetermined value as shown in FIG. 12A according to the aforementioned embodiment, the trigger voltage may be applied only when the first pulse is applied. Thereafter, the current waveform as shown in FIG. 12B is provided only by outputting the pulse signal as shown in FIG. 12A to the gate of the IGBT 96 without the application of the trigger voltage. In other words, the timing of the application of the trigger voltage may be arbitrarily determined as long as the timing of the current flow through the flash lamp FL coincides with the turning on of the pulse signal.

Although the IGBT 96 is used as a switching element in the aforementioned embodiment, another transistor capable of turning on and off the circuit in accordance with the signal level inputted to the gate thereof may be used in place of the IGBT 96. It is, however, preferable to use an IGBT and a GTO (Gate Turn Off) thyristor which are suitable for handling high power as a switching element because the emission of light from the flash lamps FL consumes considerably high power.

Also, a circuit configuration different from that shown in FIG. 8 may be employed as long as multi-stage irradiation with light from the flash lamp FL is achieved. For example, a plurality of power supply circuits having different coil constants may be connected to a single flash lamp FL. Also, as long as the multi-stage irradiation with light is achieved, the light source is not limited to the flash lamp FL, but is required only to be capable of emitting light for not more than one second. As an example, a laser may be used as the light source.

Although the 30 flash lamps FL are provided in the flash heating part 5 according to the aforementioned embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Also, in the aforementioned embodiment, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate.

Also, a substrate to be treated by the heat treatment apparatus according to the present invention is not limited to a semiconductor wafer of silicon having a diameter of 300 mm, but may be a semiconductor wafer having a diameter of, for example, 200 mm or 450 mm. Semiconductor wafers having different diameters have different thicknesses based on standards, and accordingly differ in the heat conduction time period required for heat conduction from a first surface to a second surface. Even in such a case, when the flash irradiation time period is made longer than the heat conduction time period required for the heat conduction from the first surface to the second surface and the difference in temperature between the first and second surfaces of the semiconductor wafer is controlled to be always not more than one-half of the increased temperature from the preheating temperature T1 to the target temperature T2 during the flash irradiation, the concentration of stresses on the first surface (or the second surface) of the wafer resulting from a difference in thermal expansion between the front and back surfaces is alleviated, so that the cracking of the semiconductor wafer W is prevented.

Further, a substrate to be treated by the heat treatment apparatus according to the present invention may be a semiconductor wafer of silicon having a front surface with a predetermined film formed thereon. For example, when a resist film is formed on the front surface of the semiconductor wafer, a PEB (Post Exposure Bake) process and a PAB (Post Applied Bake) process may be performed by the flash irradiation. Since the target temperature required for these heat treatments is relatively low (100° to 200° C.), it is preferable to perform the flash irradiation on the back surface of the semiconductor wafer with the resist film formed thereon.

Also, after a nickel film is deposited on the front surface of a semiconductor wafer, the heat treatment apparatus according to the present invention may perform the flash heating process to form nickel silicide (silicidation). Further, after a high dielectric constant film (High-k film) including hafnium and the like is formed on the front surface of a semiconductor wafer, the heat treatment apparatus according to the present invention may perform the flash heating process to promote the crystallization of the high dielectric constant film. These heat treatments require longer time than the activation of impurities. By making the flash irradiation time period in the entire flash heating step longer than the heat conduction time period, the front surface of the semi-conductor wafer W is heated to a necessary temperature for a necessary time period, so that a desired treatment is performed. By controlling the difference in temperature between the front and back surfaces of the semiconductor wafer to be always not more than one-half of the increased temperature from the preheating temperature T1 to the target temperature T2 during the flash irradiation, an excessively large difference in temperature between the front and back surfaces is suppressed. This alleviates the concentration of stresses resulting from a difference in thermal expansion between the front and back surfaces to prevent the cracking of the semiconductor wafer.

Moreover, a substrate to be treated by the heat treatment apparatus according to the present invention may be a glass substrate for use in a flat panel display for a liquid crystal display apparatus and the like, and a substrate for a solar cell. Also, the technique according to the present invention may be applied to the joining of metal and silicon, and to the crystallization of polysilicon.

REFERENCE SIGNS LIST

1 Heat treatment apparatus
2 Shutter mechanism
3 Controller
4 Halogen heating part
5 Flash heating part
6 Chamber
7 Holder
10 Transfer mechanism
21 Shutter plate
22 Sliding drive mechanism
31 Pulse generator
32 Waveform setting part
33 Input part
61 Chamber side portion
62 Recessed portion
63 Upper chamber window
64 Lower chamber window
65 Heat treatment space
74 Susceptor
91 Trigger electrode
92 Glass tube
93 Capacitor
94 Coil
96 IGBT
97 Trigger circuit
FL Flash lamps
HL Halogen lamps
W Semiconductor wafer

The invention claimed is:
1. A heat treatment method for heating a substrate by irradiating the substrate with light, the heat treatment method comprising:
   a preheating step for heating a substrate at a predetermined preheating temperature; and
   a flash heating step for irradiating a first surface of said substrate with a flash of light from a flash lamp to heat said first surface to a target temperature,
   wherein a flash irradiation time period in said flash heating step is longer than a heat conduction time period required for heat conduction from said first surface to a second surface which is a surface opposite from said first surface, and
   wherein a difference in temperature between said first and second surfaces in the entire flash heating step is not more than one-half of an increased temperature from said preheating temperature to said target temperature.

2. The heat treatment method according to claim 1, wherein
a rate of increase in temperature of said first surface in said flash heating step is not less than 1000° C./sec.

3. The heat treatment method according to claim 1, wherein
said substrate is a semiconductor wafer of silicon.

4. The heat treatment method according to claim 1, wherein
a switching element intermittently supplies electrical charges from a capacitor to said flash lamp to control an emission output from said flash lamp in said flash heating step.

5. The heat treatment method according to claim 4, wherein
said flash heating step performs two-stage irradiation including:
a first irradiation applying pulses which are longer in pulse width than in time intervals to a gate of said switching element so as to increase the emission output of said flash lamp, and
a second irradiation applying pulses which are longer in time intervals than in pulse width to said gate of said switching element so as to decrease the emission output of said flash lamp.

* * * * *